(12) United States Patent
Tomita

(10) Patent No.: US 7,723,796 B2
(45) Date of Patent: May 25, 2010

(54) SEMICONDUCTOR DEVICE WITH CURRENT MIRROR CIRCUIT HAVING TWO TRANSISTORS OF IDENTICAL CHARACTERISTICS

(75) Inventor: Hiroyoshi Tomita, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 259 days.

(21) Appl. No.: 11/902,568

(22) Filed: Sep. 24, 2007

(65) Prior Publication Data

US 2008/0079481 A1 Apr. 3, 2008

(30) Foreign Application Priority Data

Sep. 29, 2006 (JP) ............................... 2006-269628

(51) Int. Cl.
*H01L 23/62* (2006.01)
(52) U.S. Cl. ................. 257/368; 257/401; 257/E21.444
(58) Field of Classification Search ................. 257/401, 257/E21.444, 368
See application file for complete search history.

(56) References Cited

U.S. PATENT DOCUMENTS

| | | | |
|---|---|---|---|
| 5,838,050 A | * | 11/1998 | Ker et al. ..................... 257/401 |
| 5,895,956 A | * | 4/1999 | Oowaki et al. ............... 257/350 |
| 6,130,461 A | | 10/2000 | Oowaki |
| 6,342,408 B1 | | 1/2002 | Oowaki |
| 6,545,323 B2 | | 4/2003 | Oowaki |
| 7,371,626 B2 | * | 5/2008 | Chindalore .................. 438/183 |

FOREIGN PATENT DOCUMENTS

JP 08-213564 A 8/1996

\* cited by examiner

*Primary Examiner*—Thanh V Pham
*Assistant Examiner*—Caleb Henry
(74) *Attorney, Agent, or Firm*—Fujitsu Patent Center

(57) ABSTRACT

A semiconductor device includes a current-mirror circuit including a first ring-shape gate, a second ring-shape gate, a first diffusion layer formed around the first ring-shape gate and the second ring-shape gate, a second diffusion layer formed inside the first ring-shape gate, a third diffusion layer formed inside the second ring-shape gate, an interconnect line electrically connecting the first ring-shape gate and the second ring-shape gate to a same potential, and an STI area formed around the first diffusion layer, wherein a first transistor corresponding to the first ring-shape gate and a second transistor corresponding to the second ring-shape gate constitute the current-mirror circuit, wherein gates of dummy transistors that do not function as transistors are situated between the STI area and the first and second ring-shape gates, and are arranged both in a first direction and in a second direction substantially perpendicular to the first direction.

11 Claims, 7 Drawing Sheets

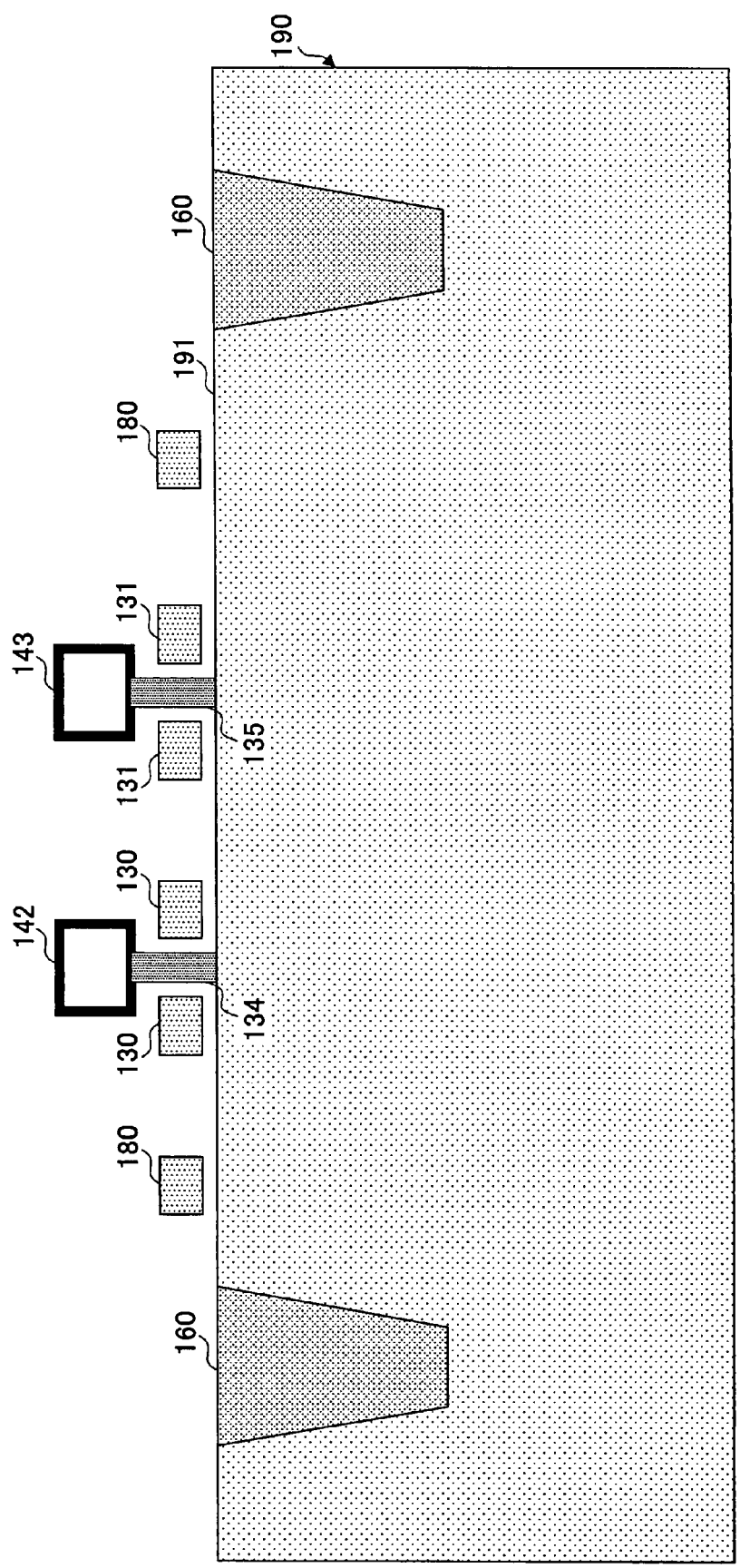

SEMICONDUCTOR DEVICE WITH CURRENT MIRROR CIRCUIT HAVING TWO TRANSISTORS OF IDENTICAL CHARACTERISTICS

CROSS-REFERENCE TO RELATED APPLICATIONS

The present application is based upon and claims the benefit of priority from the prior Japanese Patent Application No. 2006-269628 filed on Sep. 29, 2006, with the Japanese Patent Office, the entire contents of which are incorporated herein by reference.

BACKGROUND OF THE INVENTION

1. Field of the Invention

The present invention generally relates to semiconductor devices, and particularly relates to a semiconductor device having a sense circuit utilizing a current-mirror circuit.

2. Description of the Related Art

In circuits provided inside a semiconductor memory device, a plurality of different potentials are generated from an external power supply. Such potentials include the HIGH level and LOW level of word lines, the back-bias level of a memory-cell array portion, the short-circuit level of bit lines, etc. In order to adjust these potentials to desired levels, provision is generally made such that a sense circuit utilizing a current-mirror circuit is used to compare a generated potential with a predetermined reference potential, thereby adjusting the level of the generated potential in response to the outcome of the comparison.

It is necessary for a pair of transistors used in the current-mirror circuit to have identical transistor characteristics so as to increase the accuracy of the generated potential. As the size of devices decreases due to the development of semiconductor technologies, process variation increases, so that variation in characteristics between transistors cannot be avoided even if the transistors are disposed side by side in close proximity.

FIG. 1 is a drawing showing an example of the layout of a related-art current-mirror circuit. The current-mirror circuit of FIG. 1 includes gates 10 and 11, diffusion layers 12A and 12B, diffusion layers 13A and 13B, contacts 14 through 19, power supply lines 20 and 21, and signal lines 22 through 24. The diffusion layers 12A and 12B and the diffusion layers 13A and 13B are formed by diffusing impurity in the semiconductor substrate. The gates 10 and 11 are disposed on the semiconductor substrate via a gate insulating film therebetween. The power supply lines 20 and 21 are arranged in a metal layer, and are connected to the diffusion layers 12A and 13A, respectively, via the respective contacts 14 and 16. The signal lines 22 and 23 are arranged in a metal layer, and are connected to the diffusion layers 12B and 13B, respectively, via the respective contacts 15 and 17. The signal line 24 is arranged in a metal layer, and is connected to the gates 10 and 11 via the respective contacts 18 and 19.

The gate 10 and the diffusion layers 12A and 12B together constitute a first transistor, and the gate 11 and the diffusion layers 13A and 13B together constitute a second transistor. The gate of the first transistor and the gate of the second transistor are both connected to the signal line 24, and the source of the first transistor and the source of the second transistor are both connected to the power supply voltage. Such arrangement forms a current-mirror circuit, in which the same amount of electrical current flows through the first transistor and the second transistor.

In the layout shown in FIG. 1, the power supply nodes are positioned on the same side of the gates so as to achieve the same positional arrangement for the purpose of providing the same transistor characteristics. Further, such a design as to elongate the length of the transistor gates is devised. Since the transistor characteristics vary due to variation in the gate length, the elongation of the gate length can reduce variation in the transistor characteristics by making the variation of the gate length less significant in comparison with the entire length of the gate.

In semiconductor devices, conventionally, LOCOS (local oxidation of silicon) is used for the purpose of device separation. In the LOCOS method, a mask made of a nitride film or the like is formed on a silicon substrate, and an oxide film for the purpose of device separation is formed through thermal oxidation. Due to diffusion occurring during the thermal oxidation, the side of the generated oxide film does not have a steep slope.

In consideration of this, STI (shallow trench isolation) has recently been used for the purpose of device separation in place of LOCOS. In STI, grooves are formed in a silicon substrate through dry etching, and the generated grooves are then filled with oxide films for the purpose of device separation. The oxide films formed through STI have a steep side slope, allowing devices to be densely arranged. STI, however, etches a silicon substrate through dry etching, so that a mechanical stress is generated on the STI interface (i.e., the side wall of a trench) during this process. This stress affects the channel portion of a transistor, thereby changing the mobility of carriers inside the channel. Further, this stress is affected sensitively by the state of the STI interface, and, thus, significantly varies depending on its position.

Because of this, if STI-based oxide films fill the perimeters of the diffusion layers 12A and 12B and the diffusion layers 13A and 13B in the layout of the current-mirror circuit shown in FIG. 1, the channels situated below the gates 10 and 11 are affected near the borders between the diffusion layers 12A and 12B and the oxide films and between the diffusion layers 13A and 13B and the oxide films, resulting in variation in the threshold voltage of transistors. In order to avoid this, it is preferable to refrain from providing a transistor gate near the boarders of a diffusion layer. A contact for a gate, however, is difficult to form at position within a diffusion layer, and thus has to be formed outside the diffusion layer. In the configuration shown in FIG. 1, accordingly, a transistor gate ends up being situated at the borders of a diffusion layer.

FIG. 2 is a drawing showing an example of the layout of a related-art current-mirror circuit that utilizes transistors having a ring-shape gate.

The current-mirror circuit of FIG. 2 includes ring-shape gates 30 and 31, diffusion layers 32A through 32C, contacts 33 through 37, gate extension parts 38 and 39, a power supply line 40, and signal lines 41 and 42. The diffusion layers 32A through 32C are generated by diffusing impurity in a semiconductor substrate. The ring-shape gates 30 and 31 and the gate extension parts 38 and 39 are disposed on the semiconductor substrate via a gate insulating film therebetween. The gate extension parts 38 and 39 are connected to the ring-shape gates 30 and 31, respectively, and serve to extend the ring-shape gates 30 and 31 to the contact position provided outside the diffusion layer 32A.

The power supply line 40 is arranged in a metal layer, and is connected to the diffusion layer 32A via the contact 33. The signal line 41 is arranged in a metal layer, and is connected to the gate extension parts 38 and 39 via the respective contacts 36 and 37.

The signal line 42 is arranged in a metal layer, and is connected to the diffusion layer 32B via the contact 34. The signal line 43 is arranged in a metal layer, and is connected to the diffusion layer 32C via the contact 35.

The ring-shape gate 30 and the diffusion layers 32A and 32B together constitute a first transistor, and the ring-shape gate 31 and the diffusion layers 32A and 32C together constitute a second transistor. The gate of the first transistor and the gate of the second transistor are both connected to the signal line 41, and the source of the first transistor and the source of the second transistor are both comprised of the common diffusion layer 32A, which is connected to the power supply voltage of the power supply line 40. Such arrangement forms a current-mirror circuit, in which the same amount of electrical current flows through the first transistor and the second transistor. The signal line 44 serves to connect the gates of the first and second transistors to the drain of the first transistor, and becomes necessary when the current-mirror circuit of FIG. 2 is used as part of a sense circuit.

In the layout of FIG. 2, the gate extension parts 38 and 39 do not function as transistor gates. This is because both the left-hand side and right-hand side of the gate extension part 38 are the same diffusion layer 32A, and are electrically coupled to the same power supply potential via the power supply line 40. Namely, only the ring-shape gates 30 and 31 function as a transistor gate. Accordingly, even when the perimeter of the diffusion layer 32A is formed by use of an STI structure for the purpose of device isolation, no transistor gate is situated at the STI interface (i.e., at the side wall of a trench), which makes it easier to provide the same transistor characteristics between the first transistor and the second transistor, compared with the configuration shown in FIG. 1.

Even with the configuration shown in FIG. 2, however, there is still the problem of stress in that the transistors are affected by stresses. This is because stresses created during the dry etching process of forming grooves in the silicon substrate have an effect that reaches the position of the ring-shape gates 30 and 31 through the crystal structure. Because of this, the transistor characteristics of each transistor vary depending on the distribution of a stress, the distance from the STI interface, etc.

[Patent Document 1] Japanese Patent Application Publication No. 08-213564

There is thus a need for a semiconductor device that is configurable in such manner that a pair of transistors constituting a current-mirror circuit in a sense circuit has identical characteristics.

SUMMARY OF THE INVENTION

According to an aspect of an embodiment, a semiconductor device includes a current-mirror circuit including a semiconductor substrate, a first ring-shape gate formed on a surface of the semiconductor substrate, a second ring-shape gate formed on the surface of the semiconductor substrate, a first diffusion layer formed in the semiconductor substrate around the first ring-shape gate and the second ring-shape gate, a second diffusion layer formed in the semiconductor substrate inside the first ring-shape gate, a third diffusion layer formed in the semiconductor substrate inside the second ring-shape gate, an interconnect line electrically connecting the first ring-shape gate and the second ring-shape gate to a same potential, and an STI area formed in the semiconductor substrate around the first diffusion layer, wherein a first transistor corresponding to the first ring-shape gate and a second transistor corresponding to the second ring-shape gate constitute the current-mirror circuit, a third transistor having an end of a channel thereof coupled to a drain of the first transistor, a fourth transistor having an end of a channel thereof coupled to a drain of the second transistor, a fifth transistor connected both to another end of the channel of the third transistor and to another end of the channel of the fourth transistor, and gates of dummy transistors that do not function as transistors, the gates being situated between the STI area on one side and the first ring-shape gate and the second ring-shape gate on another side and being arranged both in a first direction parallel to the surface of the semiconductor substrate and in a second direction parallel to the surface and substantially perpendicular to the first direction.

According to at lest one embodiment of the present invention, the dummy transistors are provided between the STI area and the first and second transistors of the current-mirror circuit and arranged in a plurality of directions around the first and second transistors, so that the effect of the stress generated at the interface of the STI area is blocked by the dummy transistors, mostly failing to reach the first and second transistors of the current-mirror circuit. With this provision, thus, it is possible to make the first and second transistors of the current-mirror circuit have substantially the same transistor characteristics.

BRIEF DESCRIPTION OF THE DRAWINGS

Other objects and further features of the present invention will be apparent from the following detailed description when read in conjunction with the accompanying drawings, in which:

FIG. 7 is a cross sectional view of the current-mirror circuit shown in FIG. 7 as taken along a line B-B'.

DESCRIPTION OF THE PREFERRED EMBODIMENTS

In the following, embodiments of the present invention will be described with reference to the accompanying drawings.

Figure 3:
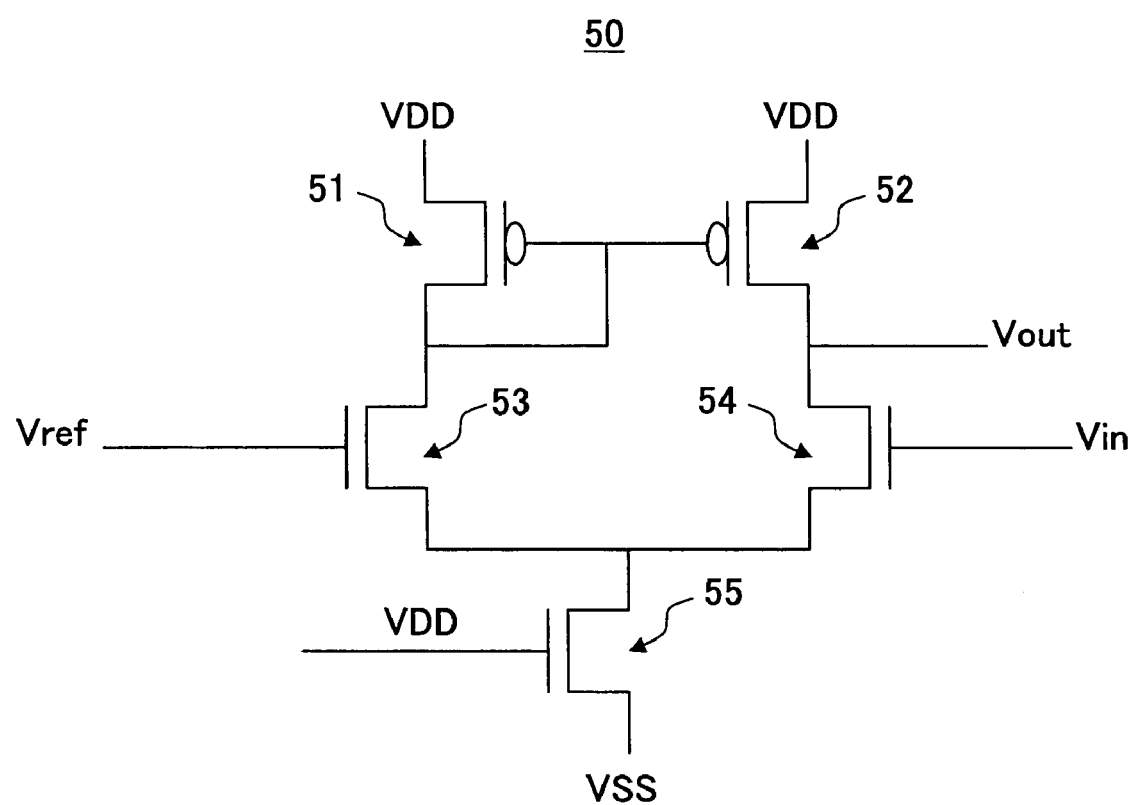
FIG. 3 is a drawing showing the configuration of a sense circuit utilizing a current-mirror circuit to which the present invention is applied.

FIG. 3 is a drawing showing the configuration of a sense circuit utilizing a current-mirror circuit to which the present invention is applied. A sense circuit 50 shown in FIG. 3 includes PMOS transistors 51 and 52 and NMOS transistors 53 through 55.

The gates of the PMOS transistors 51 and 52 are connected to each other, and the sources of the PMOS transistors 51 and 52 are connected to a power supply voltage VDD. Thus, the PMOS transistors 51 and 52 constitute a current-mirror circuit, and identical drain currents flow through the PMOS transistors 51 and 52, respectively. The gates of the PMOS transistors 51 and 52 are connected to the drain of the PMOS transistor 51.

The drain of the PMOS transistor 51 is connected to the drain of the NMOS transistor 53. Further, the drain of the PMOS transistor 52 is connected to the drain of the NMOS transistor 54. The source of the NMOS transistor 53 and the source of the NMOS transistor 54 are both connected to the drain of the NMOS transistor 55. The source of the NMOS transistor 55 is connected to a power supply voltage VSS on the ground side. The gate of the NMOS transistor 55 is fixed to the power supply voltage VDD, and the NMOS transistor 55 serves as a constant current source.

The gate of the NMOS transistor 53 receives a reference voltage Vref that is fixed to a predetermined potential, and the gate of the NMOS transistor 54 receives an input potential Vin that is an object potential to be detected. The NMOS transistor 53 and the NMOS transistor 54 become nonconductive and conductive, respectively, when the input potential Vin is higher than the reference voltage Vref. As a result, an output potential Vout appearing at a joint point between the PMOS transistor 52 and the NMOS transistor 54 becomes LOW. The NMOS transistor 53 and the NMOS transistor 54 become conductive and nonconductive, respectively, when the input potential Vin is lower than the reference voltage Vref. As a result, the output potential Vout appearing at a joint point between the PMOS transistor 52 and the NMOS transistor 54 becomes HIGH.

In the manner described above, a comparison between the input potential Vin and the reference voltage Vref is performed, and the outcome of the comparison is output as the output potential Vout. In the present invention, the layout of the current-mirror circuit comprised of the PMOS transistors 51 and 52 in the sense circuit as shown in FIG. 3 has a characteristic feature.

Figure 4:
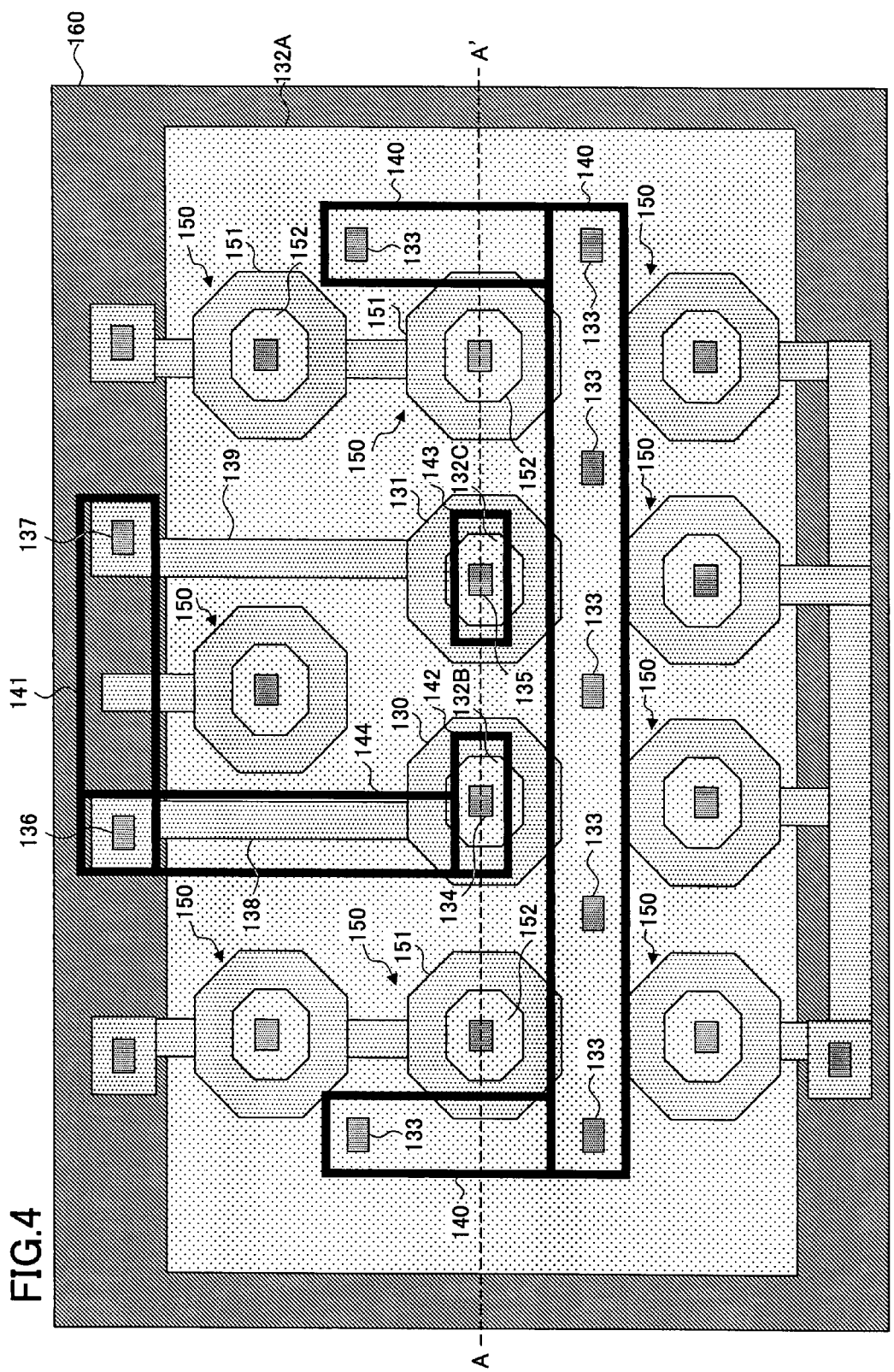
FIG. 4 is a drawing showing a first embodiment of the layout of a current-mirror circuit provided in the sense circuit shown in FIG. 3.

FIG. 4 is a drawing showing a first embodiment of the layout of a current-mirror circuit provided in the sense circuit shown in FIG. 3.

The current-mirror circuit of FIG. 3 includes ring-shape gates 130 and 131, diffusion layers 132A through 132C, contacts 133 through 137, gate extension parts 138 and 139, a power supply line 140, signal lines 141 and 142, and a plurality of dummy transistors 150. An STI area 160 is formed around the diffusion layer 132A. The STI area 160 is configured such that grooves are formed in a silicon substrate through dry etching, and the generated grooves are then filled with oxide films (SiO2) for the purpose of device separation.

Each of the dummy transistors 150 includes a ring-shape gate 151 and a diffusion layer 152 inside the ring. For the sake of convenience of illustration, some but not all of the dummy transistors 150 are designated by the reference numbers 151 and 152.

The diffusion layers 132A through 132C and 152 are generated by diffusing impurity in a semiconductor substrate. The ring-shape gates 130, 131, and 150 and the gate extension parts 138 and 139 are disposed on the semiconductor substrate via a gate insulating film therebetween. The gate extension parts 138 and 139 are connected to the ring-shape gates 130 and 131, respectively, and serve to extend the ring-shape gates 130 and 131 to the contact position provided outside the diffusion layer 132A. A gate extension part similar to the gate extension parts 138 and 139 is provided for the ring-shape gate 151 of each of the dummy transistors 150.

The power supply line 140 is arranged in a metal layer, and is connected to the diffusion layer 132A via the contacts 133. The signal line 141 is arranged in a metal layer, and is connected to the gate extension parts 138 and 139 via the respective contacts 136 and 137.

The signal line 142 is arranged in a metal layer, and is connected to the diffusion layer 132B via the contact 134. The signal line 143 is arranged in a metal layer, and is connected to the diffusion layer 132C via the contact 135.

Figure 1:
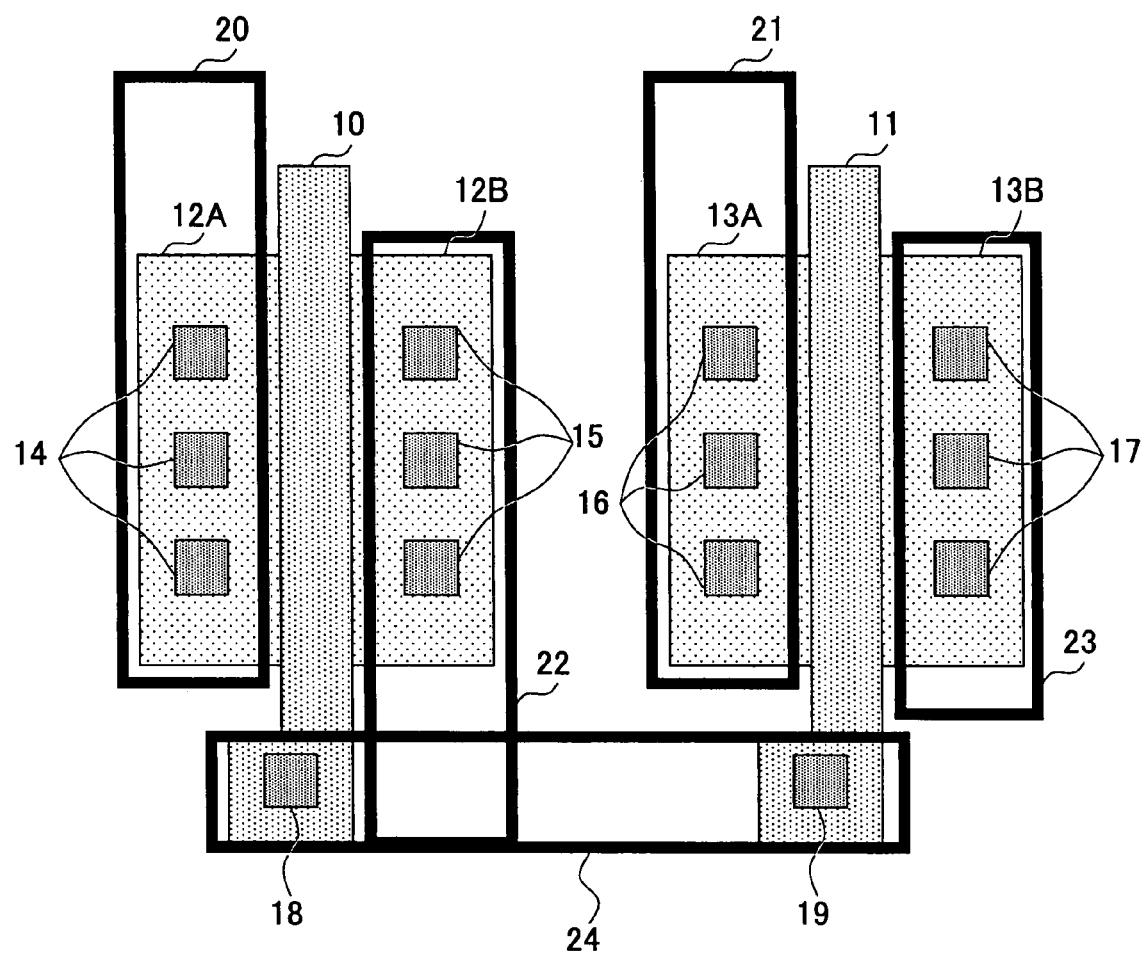
FIG. 1 is a drawing showing an example of the layout of a related-art current-mirror circuit.
Figure 2:
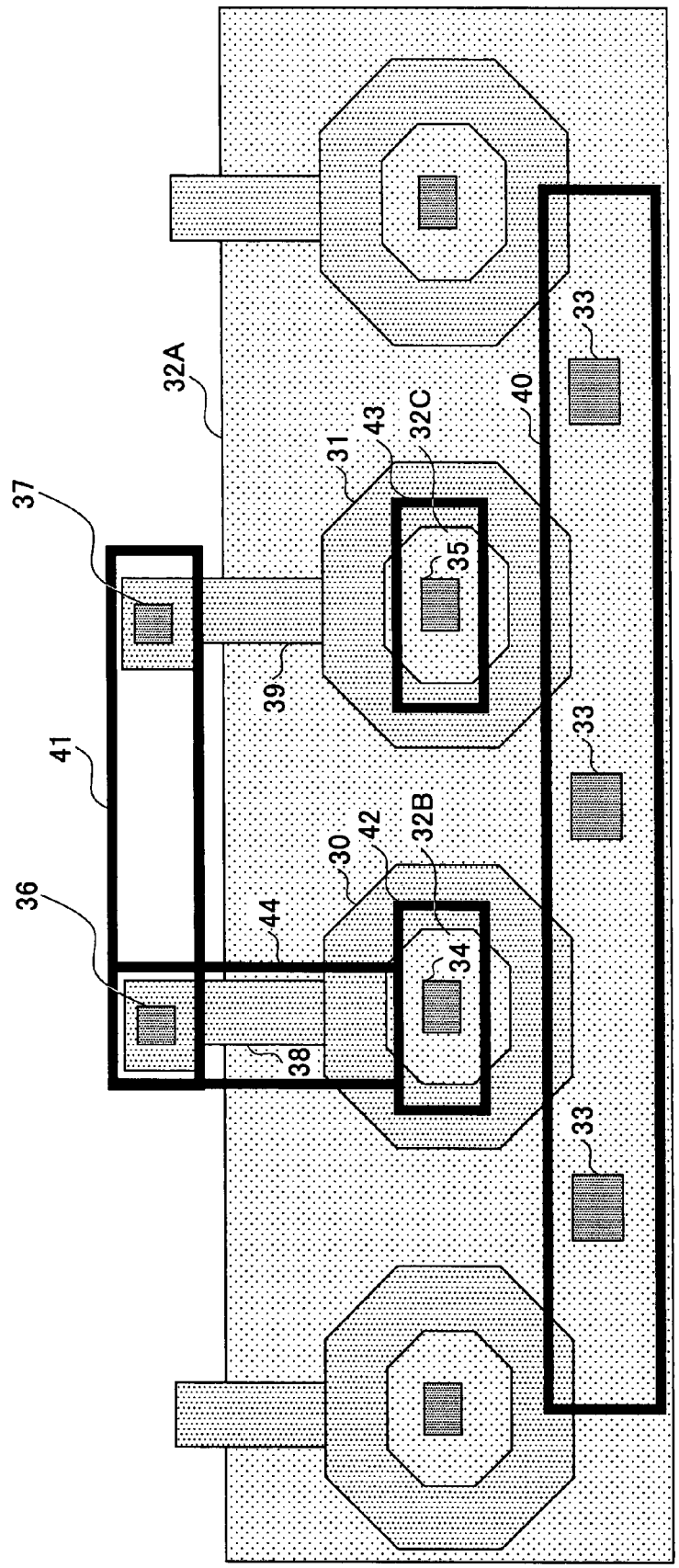
FIG. 2 is a drawing showing an example of the layout of a related-art current-mirror circuit that utilizes transistors having a ring-shape gate.

The ring-shape gate 130 and the diffusion layers 132A and 132B together constitute a first transistor (the PMOS transistor 51 shown in FIG. 3), and the ring-shape gate 131 and the diffusion layers 132A and 132C together constitute a second transistor (the PMOS transistor 52 shown in FIG. 3). The gate of the first transistor and the gate of the second transistor are both connected to the signal line 141, and the source of the first transistor and the source of the second transistor are both comprised of the common diffusion layer 132A, which is connected to the power supply voltage of the power supply line 140. Such arrangement forms a current-mirror circuit, in which the same amount of electrical current flows through the first transistor and the second transistor. The signal line 144 serves to connect the gates of the first and second transistors to the drain of the first transistor, and becomes necessary when the current-mirror circuit of FIG. 2 is used as part of a sense circuit.

Figure 5:
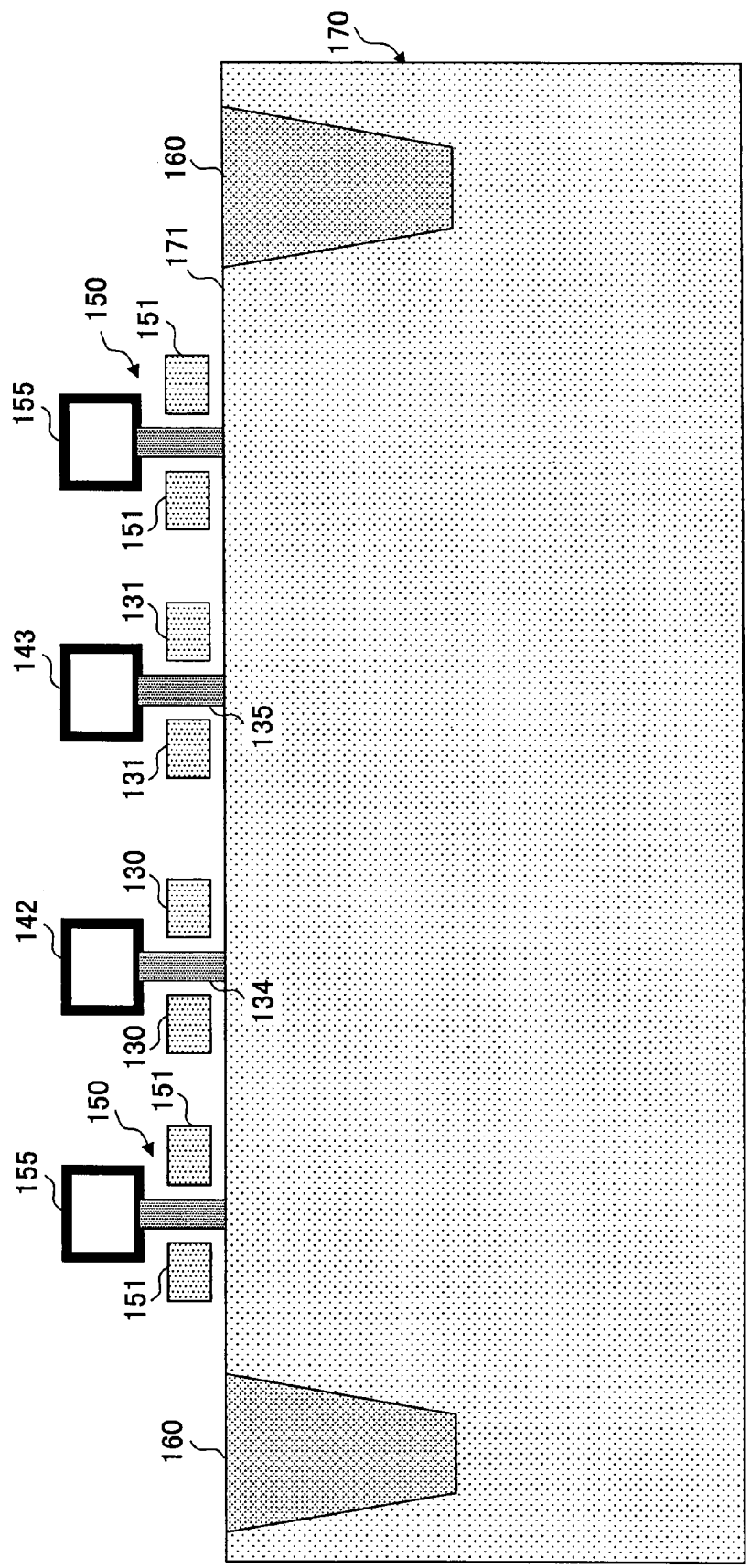
FIG. 5 is a cross sectional view of the current-mirror circuit shown in FIG. 4 as taken along a line A-A'.

FIG. 5 is a cross sectional view of the current-mirror circuit shown in FIG. 4 as taken along a line A-A'. In FIG. 5, the STI area 160 is formed in a semiconductor substrate 170. The diffusion layers 132A through 132C are formed on the inner side of the STI area 160, and the illustration of such diffusion layers 132A through 132C are omitted in FIG. 5. The ring-shape gates 130, 131, and 151 are disposed on a surface 171 of the semiconductor substrate 170. Although illustration is omitted, a gate insulating film is provided between the ring-shape gates 130, 131, and 151 and the surface 171 of the semiconductor substrate 170. As shown in FIG. 5, the diffusion layer (i.e., the diffusion layer 152 shown in FIG. 4) inside the ring-shape gate 151 of the dummy transistors 150 may be connected via a contact to a line 155 provided in a metal layer. Such connection can couple the diffusion layer 152 inside the ring-shape gate 151 and the diffusion layer 132A around the ring-shape gate 151 to the same potential.

Referring to FIG. 4 again, in the layout of FIG. 4, the gate extension parts 138 and 139 do not function as transistor gates. This is because both the left-hand side and right-hand side of the gate extension part 138 are the same diffusion layer 132A, and are electrically coupled to the same power supply potential via the power supply line 140. Namely, only the ring-shape gates 130 and 131 function as a transistor gate. Accordingly, even when the STI area 160 for the purpose of device isolation is formed along the perimeter of the diffusion layer 132A, no transistor gate is situated at the STI interface (i.e., at the side wall of a trench), which makes it easier to provide the same transistor characteristics between the first transistor and the second transistor.

In the layout shown in FIG. 4, further, the dummy transistors 150 are arranged, between the ring-shape gates, 130 and 131 and the STI area 160, both in a first direction (e.g., horizontal direction in FIG. 4) parallel to the surface 171 (see FIG. 5) of the semiconductor substrate 170 and in a second direction (e.g., vertical direction in FIG. 4) parallel to the surface 171 and substantially perpendicular to the first direction. These dummy transistors 150 do not function as transistors. In this manner, the dummy transistors 150 are provided between the STI area 160 and the first and second transistors (corresponding to the ring-shape gates 130 and 131) of the current-mirror circuit, so that the effect of the stress generated at the interface of the STI area 160 is blocked by the dummy transistors 150, mostly failing to reach the first and second transistors of the current-mirror circuit. With this provision, thus, it is possible to make the first and second transistors of the current-mirror circuit have substantially the same transistor characteristics.

To be more specific, as shown in FIG. 4, the dummy transistors 150 have the ring-shape gates 151, and are arranged both in the first direction and in the second direction such as to surround the ring-shape gates 130 and 131. The arrangement of the dummy transistors 150 in this manner makes it possible to block the effect of the stress from the STI area 160 to the ring-shape gates 130 and 131 not only in one of the first direction and the second direction but also in the other direction.

Further, since the dummy transistors 150 do not function as transistors, the source and drain of the dummy transistors may be set to the same common potential. Alternatively, one of the drain and source of the dummy transistors may be fixed to a certain potential, and the other may be set in a floating state (i.e., in a state in which no connection to a potential is given). In the layout shown in FIG. 4, one end (i.e., diffusion layer 132A) of the channel of the dummy transistors 150 is fixed to the power supply potential VDD through the power supply line 140 according to the configuration of the current-mirror circuit shown in FIG. 3. In this case, therefore, the other end (i.e., diffusion layer 152) of the channel may be fixed to the power supply potential VDD or set in a floating state (i.e., without any connection to an interconnect). The ring-shape gate 151 of the dummy transistors 150 may be set to a power supply potential.

Figure 6:
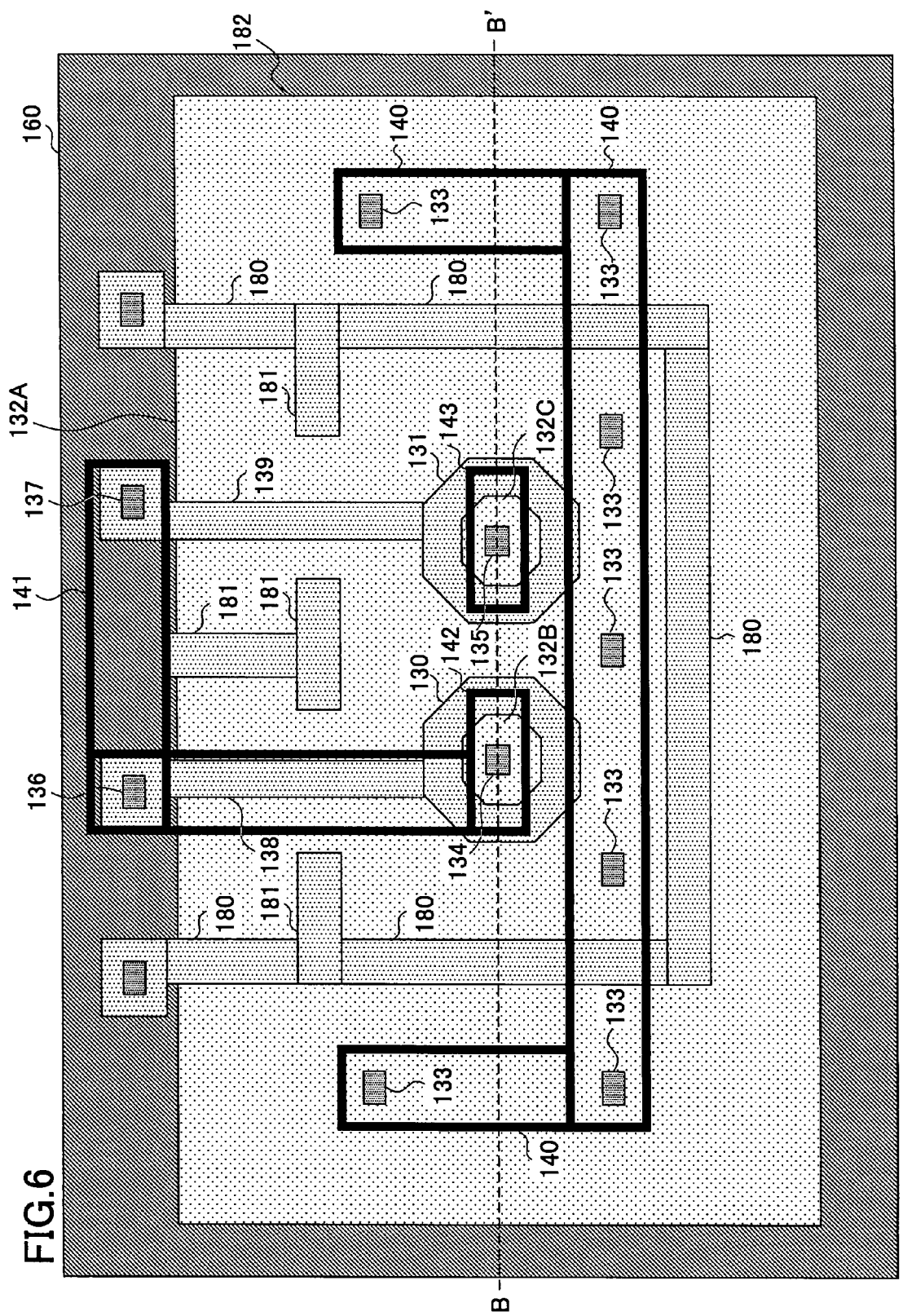
FIG. 6 is a drawing showing a second embodiment of the layout of a current-mirror circuit provided in the sense circuit shown in FIG. 3.

FIG. 6 is a drawing showing a second embodiment of the layout of a current-mirror circuit provided in the sense circuit shown in FIG. 3. In FIG. 6, the same elements as those of FIG. 4 are referred to by the same numerals.

The current-mirror circuit of FIG. 6 includes ring-shape gates 130 and 131, diffusion layers 132A through 132C, contacts 133 through 137, gate extension parts 138 and 139, a power supply line 140, signal lines 141 and 142, a plurality of dummy transistor gates 180 and 181, and a diffusion layer 182. The STI area 160 is formed around the diffusion layers 132A and 182.

The diffusion layers 132A through 132C and 182 are generated by diffusing impurity in a semiconductor substrate. The ring-shape gates 130 and 131, the gate extension parts 138 and 139, and the dummy transistor gates 180 and 181 are disposed on the semiconductor substrate via a gate insulating film therebetween. The gate extension parts 138 and 139 are connected to the ring-shape gates 130 and 131, respectively, and serve to extend the ring-shape gates 130 and 131 to the contact position provided outside the diffusion layer 132A.

The power supply line 140 is arranged in a metal layer, and may be connected to the diffusion layers 132A and 182 via the contacts 133. Such connection can couple the diffusion layer 182 situated on one side of the dummy transistor gates 180 and the diffusion layer 132A situated on the other side thereof to the same potential. The diffusion layer 182 may alternatively be set in a floating state. The signal line 141 is arranged in a metal layer, and is connected to the gate extension parts 138 and 139 via the respective contacts 136 and 137.

The signal line 142 is arranged in a metal layer, and is connected to the diffusion layer 132B via the contact 134. The signal line 143 is arranged in a metal layer, and is connected to the diffusion layer 132C via the contact 135.

The ring-shape gate 130 and the diffusion layers 132A and 132B together constitute a first transistor (the PMOS transistor 51 shown in FIG. 3), and the ring-shape gate 131 and the diffusion layers 132A and 132C together constitute a second transistor (the PMOS transistor 52 shown in FIG. 3). The gate of the first transistor and the gate of the second transistor are both connected to the signal line 141, and the source of the first transistor and the source of the second transistor are both comprised of the common diffusion layer 132A, which is connected to the power supply voltage of the power supply line 140. Such arrangement forms a current-mirror circuit, in which the same amount of electrical current flows through the first transistor and the second transistor. The signal line 144 serves to connect the gates of the first and second transistors to the drain of the first transistor, and becomes necessary when the current-mirror circuit of FIG. 2 is used as part of a sense circuit.

FIG. 7 is a cross sectional view of the current-mirror circuit shown in FIG. 7 as taken along a line B-B'. In FIG. 7, the STI area 160 is formed in a semiconductor substrate 190. The diffusion layers 132A through 132C and 182 are formed on the inner side of the STI area 160, and the illustration of such diffusion layers are omitted in FIG. 7. The ring-shape gates 130 and 131 and the dummy transistor gates 180 are disposed on a surface 190 of the semiconductor substrate 191. Although illustration is omitted, a gate insulating film is provided between the ring-shape gates 130 and 131 and the dummy transistor gates 180 on one side and the surface 190 of the semiconductor substrate 191 on the other side.

Referring to FIG. 6 again, in the layout of FIG. 6, the gate extension parts 138 and 139 do not function as transistor gates. Namely, only the ring-shape gates 130 and 131 function as a transistor gate. Accordingly, even when the STI area 160 for the purpose of device isolation is formed along the perimeter of the diffusion layer 132A, no transistor gate is situated at the STI interface (i.e., at the side wall of a trench), which makes it easier to provide the same transistor characteristics between the first transistor and the second transistor.

In the layout shown in FIG. 6, further, the dummy transistor gates 180 and 181 are arranged, between the ring-shape gates 130 and 131 and the STI area 160, both in a first direction (e.g., horizontal direction in FIG. 6) parallel to the surface 190 (see FIG. 7) of the semiconductor substrate 191 and in a second direction (e.g., vertical direction in FIG. 6) parallel to the surface 191 and substantially perpendicular to the first direction. The transistors corresponding to these dummy transistor gates 180 and 181 do not function as transistors. In this manner, the dummy transistor gates 180 and 181 are provided between the STI area 160 and the first and second transistors (corresponding to the ring-shape gates 130 and 131) of the current-mirror circuit, so that the effect of the stress generated at the interface of the STI area 160 is blocked by the dummy transistors of the dummy transistor gates 180 and 181, mostly failing to reach the first and second transistors of the current-mirror circuit. With this provision, thus, it is possible to make the first and second transistors of the current-mirror circuit have substantially the same transistor characteristics.

To be more specific, as shown in FIG. 6, the dummy transistor gates 180 and 181 have straight-line shape, and are arranged to extend in both the first direction and the second direction such as to substantially surround the ring-shape gates 130 and 131. The arrangement of the dummy transistor gates 180 and 181 in this manner makes it possible to block the effect of the stress from the STI area 160 to the ring-shape gates 130 and 131 not only in one of the first direction and the second direction but also in the other direction.

Further, since the dummy transistors corresponding to the dummy transistor gates 180 and 181 do not function as transistors, the source and drain of the dummy transistors may be set to the same common potential. Alternatively, one of the drain and source of the dummy transistors may be fixed to a certain potential, and the other may be set in a floating state (i.e., in a state in which no connection to a potential is given). In the layout shown in FIG. 6, both sides of the dummy transistor gates 181 are the same diffusion layer 132A, so that the drain and source of the relevant dummy transistors are set to the same potential. As far as the dummy transistor gates 180 are concerned, one end (i.e., diffusion layer 132A) of the channel of the dummy transistors is fixed to the power supply potential VDD through the power supply line 140 according to the configuration of the current-mirror circuit shown in FIG. 3. Accordingly, the other end (i.e., the diffusion layer 182) of the channel may be fixed to the power supply potential VDD via the power supply line 140 as exemplified in FIG. 6. Alternatively, the diffusion layer 182 may be set in a floating state (without connection to any interconnect). The dummy transistor gates 180 and 181 may be set to the power supply potential.

Further, the present invention is not limited to these embodiments, but various variations and modifications may be made without departing from the scope of the present invention.

What is claimed is:

1. A semiconductor device, comprising:
   a semiconductor substrate;
   a first ring-shape gate formed on a surface of the semiconductor substrate;
   a second ring-shape gate formed on the surface of the semiconductor substrate;
   a first diffusion layer formed in the semiconductor substrate around the first ring-shape gate and the second ring-shape gate;
   a second diffusion layer formed in the semiconductor substrate inside the first ring-shape gate;
   a third diffusion layer formed in the semiconductor substrate inside the second ring-shape gate;
   an interconnect line electrically connecting the first ring-shape gate and the second ring-shape gate to a same potential; and
   an STI area formed in the semiconductor substrate around the first diffusion layer,
   wherein a first transistor corresponding to the first ring-shape gate and a second transistor corresponding to the second ring-shape gate;
   a third transistor having an end of a channel thereof coupled to a drain of the first transistor;
   a fourth transistor having an end of a channel thereof coupled to a drain of the second transistor;
   a fifth transistor connected both to another end of the channel of the third transistor and to another end of the channel of the fourth transistor; and
   gates of dummy transistors that do not function as transistors, the gates being situated between the STI area and the first and second ring-shape gates, and being arranged both in a first direction parallel to the surface of the semiconductor substrate and in a second direction parallel to the surface and substantially perpendicular to the first direction,
   wherein the dummy transistors have a drain and a source thereof connected to a same potential.

2. The semiconductor device as claimed in claim 1, wherein the dummy transistors have one of a drain and a source thereof connected to a power supply potential and another one set in a floating state.

3. The semiconductor device as claimed in claim 2, wherein the gates of the dummy transistors are connected to the power supply potential.

4. The semiconductor device as claimed in claim 1, wherein the gates of the dummy transistors are ring-shape gates.

5. The semiconductor device as claimed in claim 4, wherein the ring-shape gates of the dummy transistors are arranged both in the first direction and in the second direction such as to surround the first ring-shape gate and the second ring-shape gate.

6. The semiconductor device as claimed in claim 1, wherein the gates of the dummy transistors are straight-line-shape gates.

7. The semiconductor device as claimed in claim 6, wherein the straight-line-shape gates of the dummy transistors are arranged to extend both in the first direction and in the second direction such as to substantially surround the first ring-shape gate and the second ring-shape gate.

8. The semiconductor device as claimed in claim 1, wherein the first transistor and the second transistor constitute a current-mirror circuit.

9. A semiconductor device, comprising:
   a semiconductor substrate;
   a first ring-shape gate formed on a surface of the semiconductor substrate;
   a second ring-shape gate formed on the surface of the semiconductor substrate;
   a first diffusion layer formed in the semiconductor substrate around the first ring-shape gate and the second ring-shape gate;
   a second diffusion layer formed in the semiconductor substrate inside the first ring-shape gate;
   a third diffusion layer formed in the semiconductor substrate inside the second ring-shape gate;
   an interconnect line electrically connecting the first ring-shape gate and the second ring-shape gate to a same potential; and
   an STI area formed in the semiconductor substrate around the first diffusion layer,
   wherein a first transistor corresponding to the first ring-shape gate and a second transistor corresponding to the second ring-shape gate;
   a third transistor having an end of a channel thereof coupled to a drain of the first transistor;
   a fourth transistor having an end of a channel thereof coupled to a drain of the second transistor;
   a fifth transistor connected both to another end of the channel of the third transistor and to another end of the channel of the fourth transistor; and
   gates of dummy transistors that do not function as transistors, the gates being situated between the STI area and the first and second ring-shape gates, and being arranged both in a first direction parallel to the surface of the semiconductor substrate and in a second direction parallel to the surface and substantially perpendicular to the first direction,
   wherein the dummy transistors have one of a drain and a source thereof connected to a power supply potential and another one set in a floating state.

10. The semiconductor device as claimed in claim 9, wherein the first transistor and the second transistor constitute a current-mirror circuit.

11. The semiconductor device as claimed in claim 9, wherein the gates of the dummy transistors are connected to the power supply potential.

* * * * *